(12) United States Patent
Lam et al.

(10) Patent No.: US 7,607,877 B1
(45) Date of Patent: Oct. 27, 2009

(54) CLINCH FOR A CIRCUIT CARD EJECTOR

(75) Inventors: Mandy Lam, Fremont, CA (US);
Jimmy C. Leung, Fremont, CA (US);
Toan Nguyen, San Jose, CA (US)

(73) Assignee: Cisco Technology, Inc., San Jose, CA (US)

( * ) Notice: Subject to any disclaimer, the term of this patent is extended or adjusted under 35 U.S.C. 154(b) by 0 days.

(21) Appl. No.: 12/070,767

(22) Filed: Feb. 21, 2008

(51) Int. Cl.
*F16B 37/04* (2006.01)
(52) U.S. Cl. .................... 411/180; 439/157; 439/160
(58) Field of Classification Search ......... 411/180–181; 439/157, 160
See application file for complete search history.

(56) References Cited

U.S. PATENT DOCUMENTS

| | | | | |
|---|---|---|---|---|
| 3,465,637 | A | * | 9/1969 | Cushman et al. .............. 411/40 |
| 4,419,344 | A | * | 12/1983 | Strasilla et al. .......... 424/70.16 |
| 4,996,631 | A | * | 2/1991 | Freehauf ...................... 361/798 |
| 6,409,444 | B2 | * | 6/2002 | Pamer et al. ................. 411/180 |
| 6,582,241 | B1 | * | 6/2003 | Lutz, Jr. ....................... 439/157 |
| 7,292,457 | B2 | * | 11/2007 | DeNies et al. .............. 361/801 |
| 7,341,467 | B2 | * | 3/2008 | Guan et al. .................. 439/160 |
| 7,374,382 | B2 | * | 5/2008 | Bentrim ....................... 411/180 |
| 7,383,624 | B2 | * | 6/2008 | Wojciechowski et al. ..... 29/521 |
| 2007/0109760 | A1 | | 5/2007 | Leung et al. |

* cited by examiner

*Primary Examiner*—Truc T Nguyen
(74) *Attorney, Agent, or Firm*—Edell, Shapiro & Finnan, LLC

(57) ABSTRACT

A clinch suitable for an ejector of a line card is disclosed. The clinch includes a cylinder, which includes a shoulder flange, an extension portion and a plurality of knurls. The shoulder flange extends radially from a first end of the cylinder, and the extension portion is formed at a second end of the cylinder. The knurls are formed at the second end surrounding the extension portion.

20 Claims, 6 Drawing Sheets

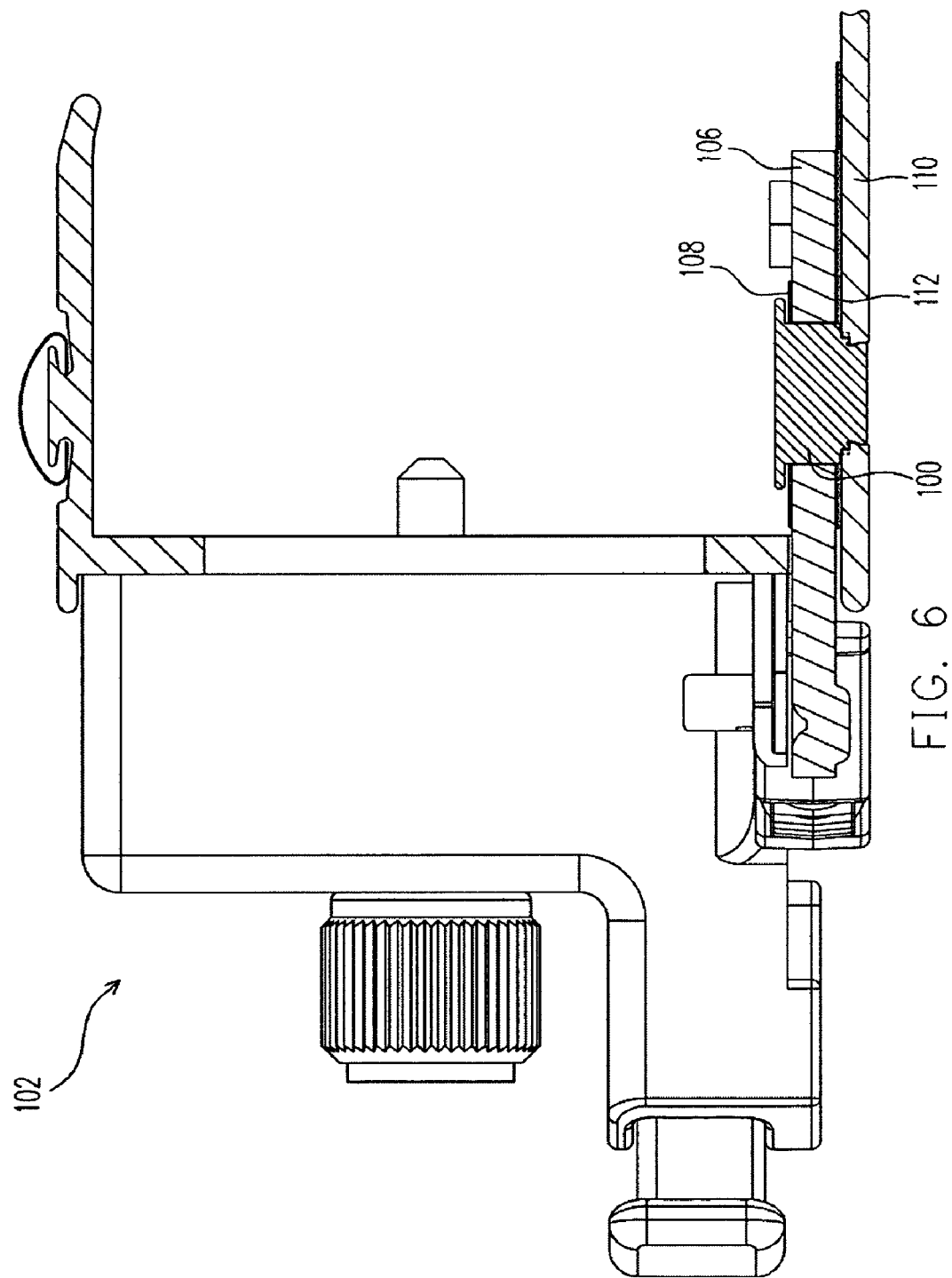

CLINCH FOR A CIRCUIT CARD EJECTOR

FIELD OF THE INVENTION

The present invention relates to a circuit card module and, more particularly, to a clinch for retaining an ejector for use with a circuit card module.

BACKGROUND

Circuit card modules (i.e., line cards) that connect to backplanes typically include ejectors (levers) that, when rotated by technicians, enable the technicians to operatively connect the line cards with the backplanes, and disconnect the line cards from the backplanes. In particular, when a technician inserts a line card into a card cage and then rotates the ejectors of line card toward the card cage, the ends of the ejectors grab the card cage and evenly guide the line card into connection with a backplane at the back of the card cage. Furthermore, when the technician rotates the ejectors of line card away from the card cage, the ends of the ejectors push against the card cage and evenly disconnect the line card from the backplane.

Internal ejectors (i.e., those that are mounted upon the circuit card module) are generally installed by flaring shoulder rivets to a base tray of the circuit card module. The rivet provides the hold-down force to keep the handle of the ejector in place while allowing the ejector to rotate about the rivet. However, due to inconsistency of the installation process used to install the rivet, the tightness and the overall reliability of the handle of the ejector after installation is extremely difficult to control. Consequently, problems arise with ejector quality. For example, inconsistent rivet flaring procedures lead to inconsistent tightness of the ejector rotation. Furthermore cracked rivets occur during the flaring process will adversely affect the reliability of the internal ejector.

BRIEF DESCRIPTION OF THE DRAWINGS

The foregoing and other objects, features and advantages of the invention will be apparent from the following description of particular embodiments of the invention, as illustrated in the accompanying drawings in which like reference characters refer to the same parts throughout the different views. The drawings are not necessarily to scale, emphasis instead being placed upon illustrating the principles of the invention.

FIG. 6 is a cross-sectional view of the clinch shown in FIG. 2 after being installed into the tray of the circuit card module.

DESCRIPTION OF EXAMPLE EMBODIMENTS

Overview

One embodiment is directed to a clinch suitable for use with an internal ejector of a circuit card module. The clinch comprises a cylinder and a shoulder flange. The cylinder comprises a first end and a second end. The shoulder flange radially extends from the first end of the cylinder. An undercut is formed in the second end of the cylinder, and a plurality of knurls are formed on the second end proximate to the undercut. The clinch provides the hold-down force to reliably maintain the handle of an ejector in place.

DETAILED DESCRIPTION

Figure 1:
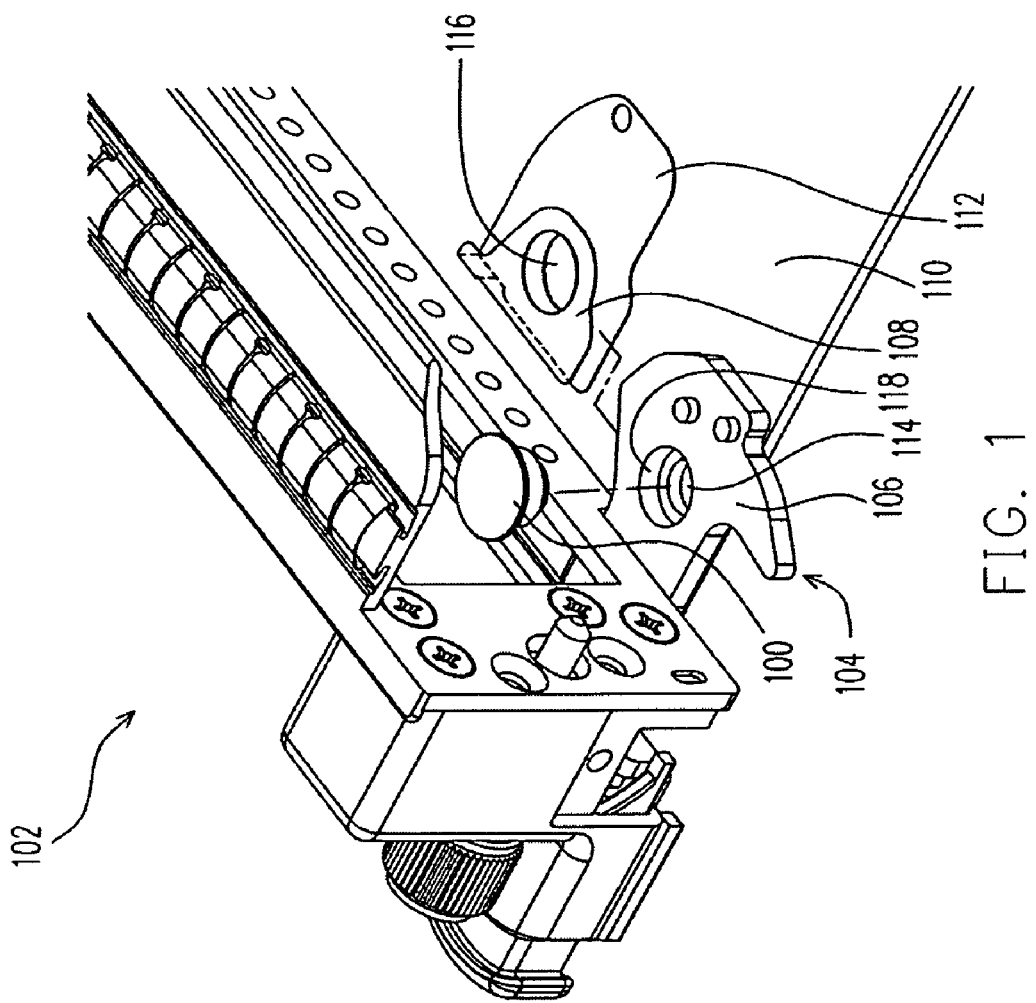
FIG. 1 illustrates an example clinch before being installed into a tray of a circuit card module.
Figure 2:
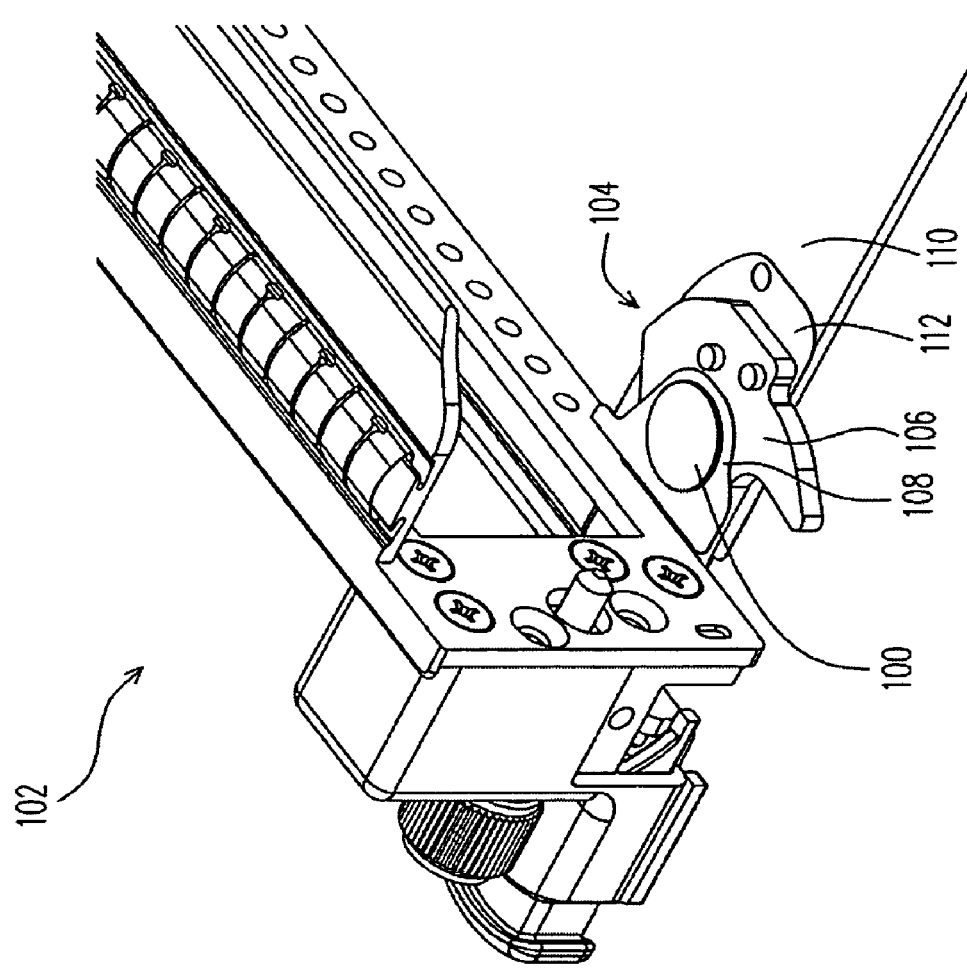
FIG. 2 illustrates the clinch shown in FIG. 1 after being installed to the tray of the circuit card module.

FIGS. 1 and 2 illustrate an example of a clinch 100 before and after being installed to a tray 110 of a circuit board module 102, respectively. As illustrated in FIGS. 1 and 2, the ejector assembly 104 of the circuit board module 102 comprises a tray 110, a rotary member 106, a electromagnetic interference (EMI) gaskets 108 and 112 (top and bottom portions respectively) and a clinch 100. The clinch 100 is suitable for passing through hole 111 of the EMI gasket and the through hole 118 of the ejector 106 and tightly fitting into a though hole 114 of the tray 110, and serves to provide the hold-down force to reliably keep the ejector assembly 104 in place. In the present embodiment, the rotary member 106 is a portion of a handle (not shown) of an ejector of the circuit card module 102.

Figure 3:
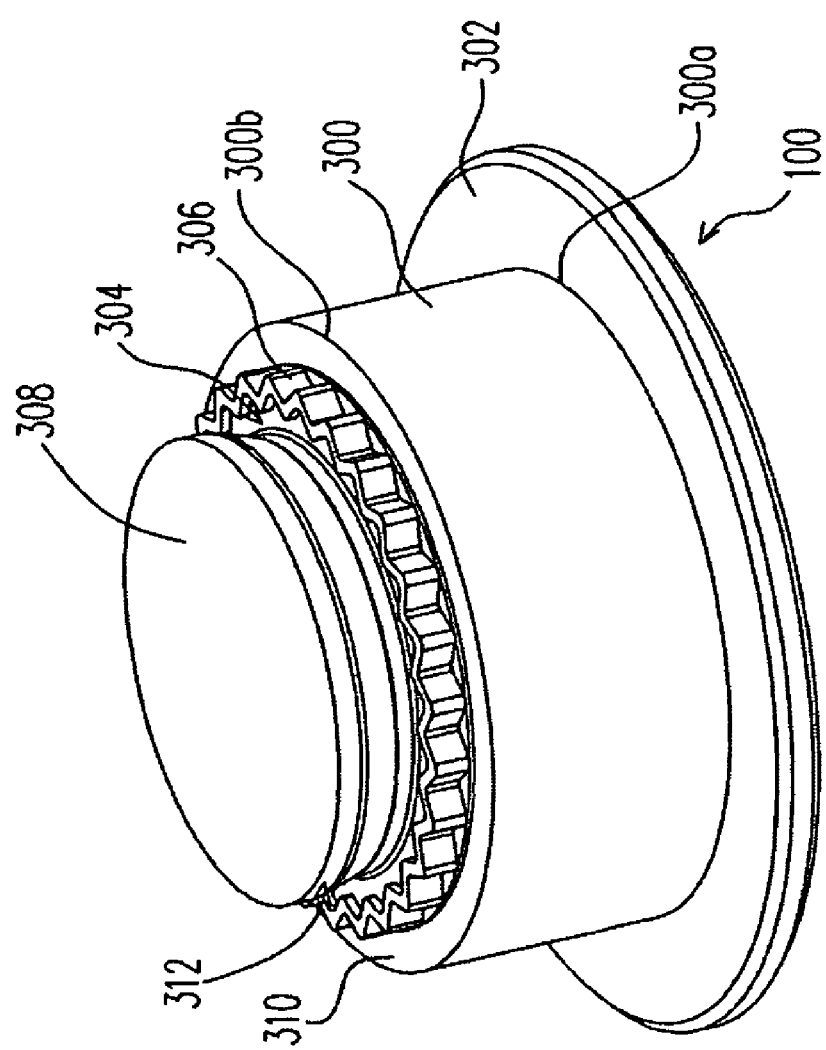
FIG. 3 is a perspective view of the clinch shown in FIG. 1.

FIG. 3 is a perspective view of the clinch 100 shown in FIG. 1. The clinch 100 comprises a cylinder 300 and a shoulder flange 302. The cylinder 300 comprises a first end 300a and a second end 300b. The shoulder flange 302 radially extends from the first end 300a of the cylinder 300 for restricting the axial displacement of the rotary member 106 relative to the tray 110. An extension portion 308 extends from the end surface 310 of the cylinder 300. The extension portion 308 has a cylindrical shape defining a side surface 312 having formed therein an undercut groove 304. A plurality of knurls 306 (an anti-rotation element) are formed on the end surface 310 to surround the undercut groove 304. The shoulder flange 302, the knurls 306 and the undercut groove 304 may be integrally formed with the cylinder 300, and may be fabricated from the same material by using any well known fabrication method, for example, but not limited, to an injection mould process, machining process and the like. In one embodiment, the knurls 306 may be configured in a form of gear-shaped structure. The undercut groove 304 may be configured such that external diameter thereof increases starting from the second end 300b of the cylinder 300 toward the distal end of the extension portion 308.

Figure 4:
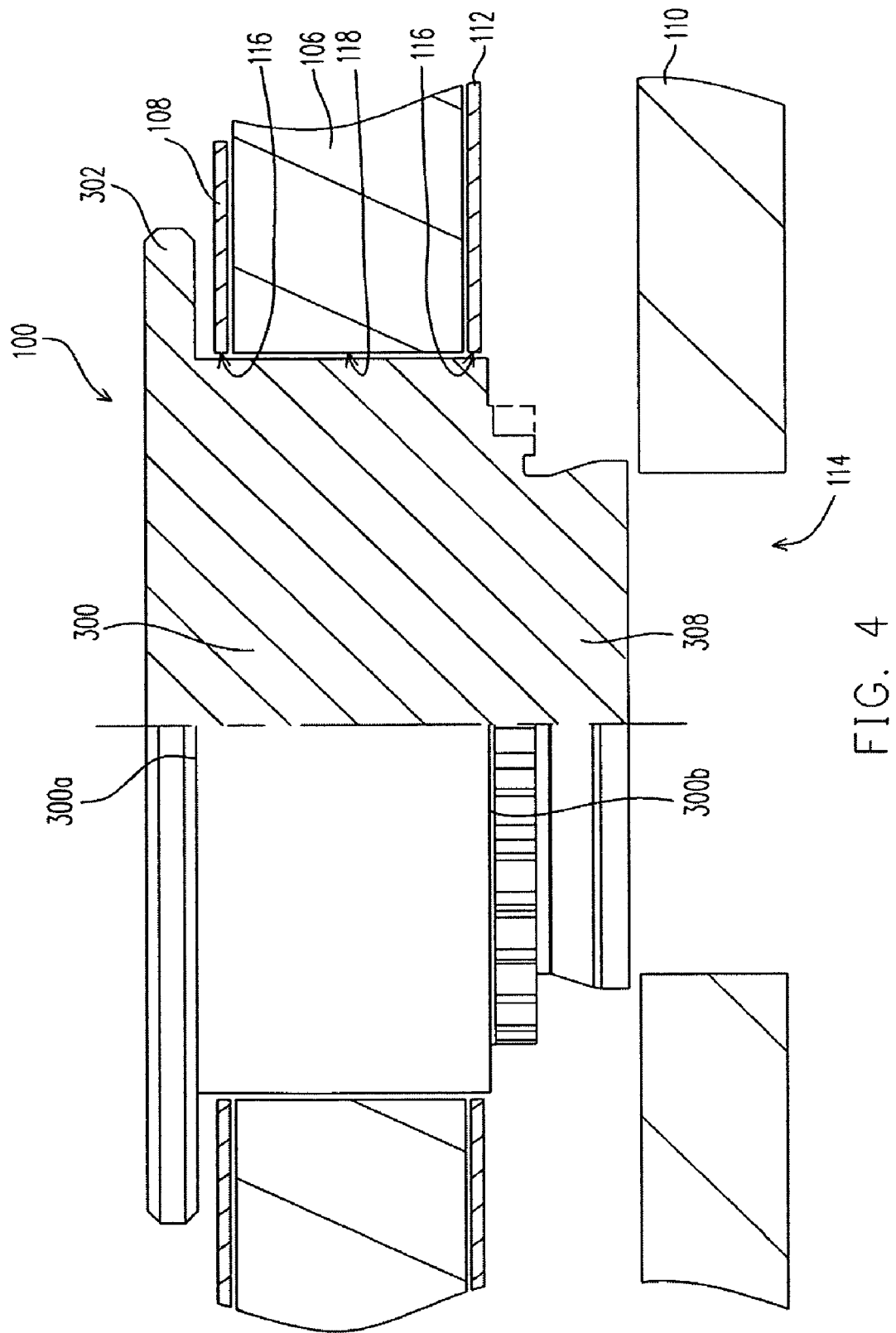
FIG. 4 illustrates the clinch before being pressed into the tray of the circuit card module.

FIG. 4 illustrates the clinch 100 before being pressed into the tray 110 of the circuit board module 102. As illustrated in FIGS. 3 and 4, in the present embodiment, the external diameter of the shoulder flange 302 is substantially greater than that of the cylinder 300, and the external diameter of the cylinder 300 corresponds to that of the internal diameter of the through holes 118 of the rotary member 106 as well as a through hole 116 in the top and bottom portions of the EMI gasket 108 and 112. The smallest external diameter of the extension portion 308 is smaller than that of the cylinder 300, and the largest diameter of the extension portion 308 corresponds with the internal diameter of the through hole 114 of the tray 110. In the present embodiment, the largest external diameter of the undercut groove 304 is slightly larger than the internal diameter of the through hole 114.

The length of the cylinder 300 corresponds to that of the through hole 400 of the rotary member 106. The height of the extension portion 308 relative the second end portion 300b of the cylinder 300 corresponds to the length of the through hole 114 of the tray 110. In one embodiment, the length of the cylinder 300 is great enough such that after being installed into the through hole 114 of the tray 110, the rotary member 106 freely rotates around the cylinder 300. The height of the member 308 is shorter than the length of the through hole 114.

According to an embodiment of the invention, the clinch 100 may be fabricated from any suitable material, such as metal.

Figure 5:
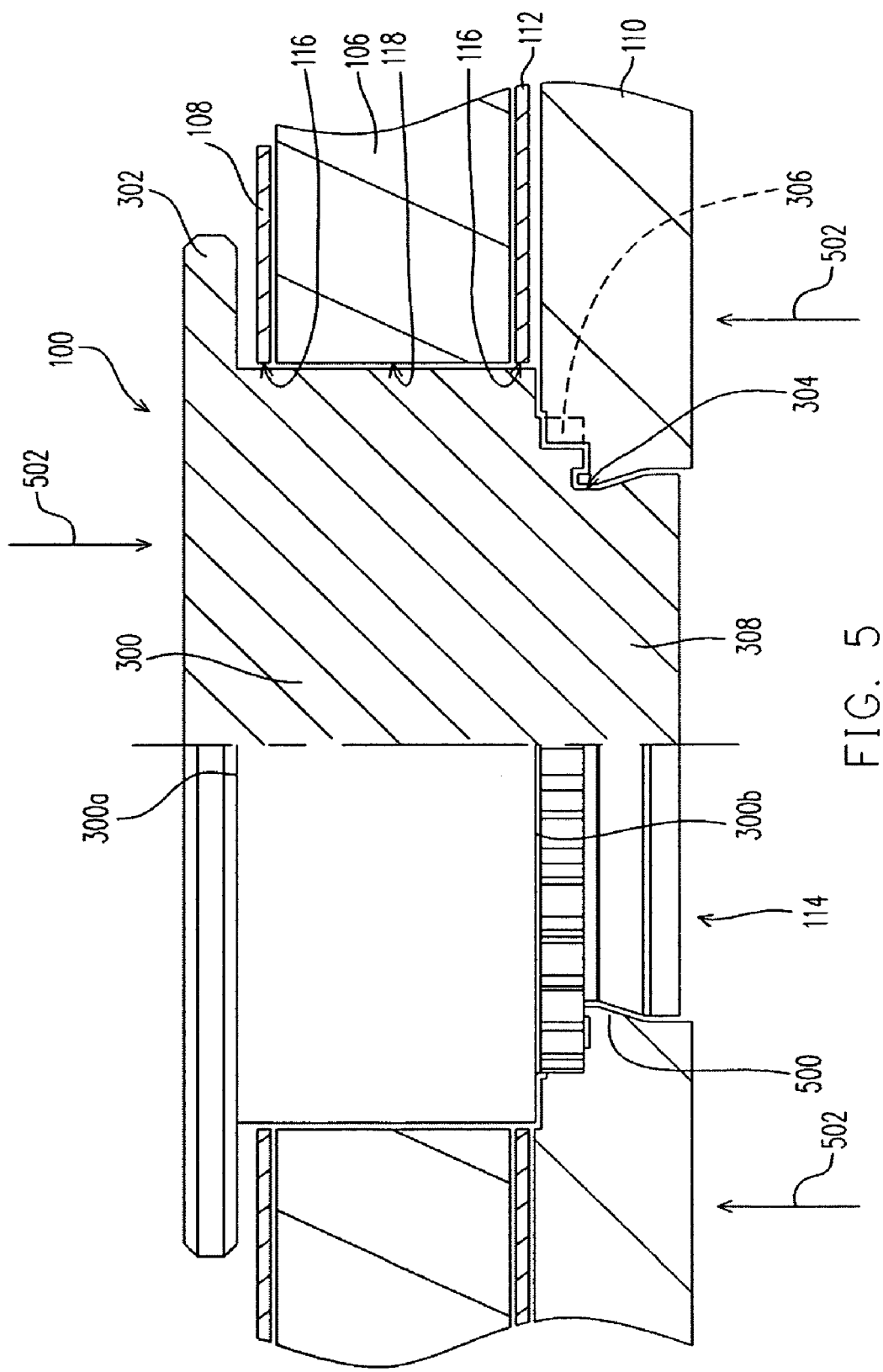
FIG. 5 illustrates the clinch after being pressed into the tray of the circuit card module.

FIG. 5 illustrates the clinch after being pressed into the tray 110 of the circuit board module 102. FIG. 6 is a cross-sectional view of the clinch shown in FIG. 2 after being installed into the tray 110 of the circuit board module 102. Hereinafter, the assembly of the clinch 100 may be described with reference to FIGS. 4, 5 and 6.

First, the bottom portion of the EMI gasket 112 is disposed on the tray 110 such that the through hole 116 of gasket portion 112 axially aligned with the through hole 114 of the tray 110. Next, the through hole 118 of the rotary member 106 is axially aligned with the through hole 116 of the gasket portion 112 and the through hole 114 of the tray 110. Next, the EMI gasket top portion is disposed on the rotary member 106 such that the through hole 116 of the EMI gasket 108 is axially aligned with the through hole 118 of the rotary member 106. Next, the extension portion 308 of the clinch 100 is axially aligned with the through hole 116 of the EMI gasket 108, and then the clinch 100 is passed through the through hole 116 of the EMI gasket 108, the through hole 118 of the rotary member 106 and the through hole 116 of the gasket portion 112. The diameter of the distal end of the extension portion 308 is slightly larger than the through hole 114. As such, the clinch 100 is press fit into the through hole 114 of the tray 110 until the shoulder flange 302 comes in contact with the EMI gasket 108.

Once aligned, a deformed portion 500 of the tray 110 surrounding the through hole 114 is pressed in the clinch 100 by a pressing tool. The pressing tool applies force (arrows 502) between the tray 110 and the clinch 100. The force is great enough (e.g., 2500 lbs. per square inch of pressure for a clinch fabricated of steel) to cause extension portion 308 to form the deformed portion 500 of the tray 110 such that the groove 304 engages the deformed portion 500 and affixes the clinch 100 to the tray 110. Furthermore, since the knurls 306 are formed surrounding the extension portion 308, the knurls 306 compress on the surface of the tray 12 and bite into the deformed portion 500 of the tray 110 under the applied pressing force. Such interaction substantially restricts the rotation of the clinch 100 relative to the tray 110. The shoulder flange 302 of the clinch 100 provides the hold-down force to maintain the rotary member 106 in place, yet enable the member 106 to rotate about the cylinder 300.

As illustrated in FIGS. 3 and 5, the knurls 306 may protrude from the shoulder 310. The protrusion provide an inner side and an outer side for contacting the deformed portion 500 of the tray 110 so as to increase the engaging area between the knurls 306 and the deformed portion 500.

The rotary member 106 may be rotated around the cylinder 300, the upper EMI gasket 108 disposed between the rotary member 106 and the shoulder flange 302 may reduce the abrasion between the rotary member 106 and the tray 110, and the lower EMI gasket 112 disposed between the rotary member 106 and the tray 110 may reduce the abrasion between the rotary member 106 and the tray 110.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A clinch for an ejector of a circuit card module, comprising:
   a cylinder, having a first end and a second end;
   a shoulder flange, extending radially from the first end of the cylinder;
   an extension portion axially extending from the second end of the cylinder, where the extension portion comprises an undercut groove; and
   a plurality of knurls formed at the second end of the cylinder proximate the extension portion.

2. The clinch of claim 1, wherein the plurality of knurls have a shape that, when installed, restricts rotation of the clinch.

3. The clinch of claim 1, wherein the plurality of knurls surrounds the extension portion.

4. The clinch of claim 1, wherein the plurality of knurls comprise gear-shaped structures.

5. The clinch of claim 1, wherein the plurality of knurls comprise protrusions extending axially from the second end of the cylinder.

6. The clinch of claim 1, wherein the extension portion has a surface that slopes outwardly along an axial length of the extension portion from the second end of the cylinder.

7. The clinch of claim 1, wherein the extension portion has a diameter that increases along the axial length of the extension portion from the second end of the cylinder.

8. An ejector assembly for a circuit card module, comprising:
   a tray defining a first through hole;
   a rotary member defining a second through hole; and
   a clinch, comprising:
   a cylinder, having a first end and a second end;
   a shoulder flange, extending radially from the first end of the cylinder;
   an extension portion axially extending from the second end of the cylinder, where the extension portion comprises an undercut groove; and
   a plurality of knurls formed at the second end of the cylinder proximate the extension portion.

9. The assembly of claim 8, wherein the rotary member comprises a handle of an ejector of the circuit board module.

10. The ejector as recited in claim 8, wherein the plurality of knurls surrounds the extension portion.

11. The ejector as recited in claim 8, wherein the plurality of knurls comprises gear-shaped structure.

12. The ejector as recited in claim 8, wherein the plurality of knurls comprise protrusions extending axially from the second end of the cylinder.

13. The ejector of claim 8, wherein the extension portion has a surface that slopes outwardly along an axial length of the extension portion from the second end of the cylinder.

14. The ejector of claim 8, wherein the extension portion has a diameter that increases along the axial length of the extension portion from the second end of the cylinder.

15. The ejector of claim 8, further comprising:
   an electromagnetic interference gasket disposed between the rotary member and the shoulder flange.

16. The ejector of claim 8, further comprising:
   an electromagnetic interference gasket disposed between the rotary member and the tray.

17. The ejector of claim 8 wherein the extension of the clinch is press fit into the first through hole.

18. The ejector of claim 17 wherein the clinch passes through the second through hole to enable the rotary member to rotate about the clinch.

19. The ejector of claim 17 wherein the force to press fit the extension portion is about 2500 pounds per square inch.

20. The ejector of claim 8 wherein the shoulder flange maintains the rotary member in position.

* * * * *